United States Patent
Cheng et al.

(10) Patent No.: US 10,573,984 B2
(45) Date of Patent: Feb. 25, 2020

(54) MOUNTING STRUCTURE OF MOUNTING BOARD-TO-BOARD (BTB) CONNECTOR TO MOBILE TERMINAL AND MOBILE TERMINAL

(71) Applicant: JRD Communication Inc., Shenzhen (CN)

(72) Inventors: Huajun Cheng, Shenzhen (CN); Benzhi Ye, Shenzhen (CN)

(73) Assignee: JRD Communication Inc., Shenzhen (CN)

( * ) Notice: Subject to any disclaimer, the term of this patent is extended or adjusted under 35 U.S.C. 154(b) by 0 days.

(21) Appl. No.: 15/744,797

(22) PCT Filed: Mar. 16, 2017

(86) PCT No.: PCT/CN2017/076978
§ 371 (c)(1),
(2) Date: Jan. 14, 2018

(87) PCT Pub. No.: WO2018/107602
PCT Pub. Date: Jun. 21, 2018

(65) Prior Publication Data
US 2019/0013605 A1  Jan. 10, 2019

(51) Int. Cl.
*H01R 12/70* (2011.01)
*H05K 1/14* (2006.01)
*H01R 13/74* (2006.01)
*H01R 12/52* (2011.01)

(52) U.S. Cl.
CPC ......... *H01R 12/7047* (2013.01); *H01R 12/52* (2013.01); *H01R 13/748* (2013.01); *H05K 1/14* (2013.01)

(58) Field of Classification Search
CPC ....................................................... H05K 1/14
USPC ................................ 439/571, 573, 574, 575
See application file for complete search history.

(56) References Cited

U.S. PATENT DOCUMENTS

| | | | |
|---|---|---|---|
| 5,826,836 A * | 10/1998 | Gallichan | B60K 37/04 248/27.3 |
| 6,030,248 A | 2/2000 | Dancel et al. | |
| 9,304,589 B2 * | 4/2016 | Sawaguchi | G06F 3/041 |
| 9,876,296 B2 * | 1/2018 | Jin | H01R 12/732 |

FOREIGN PATENT DOCUMENTS

| | | |
|---|---|---|
| CN | 2742625 | 11/2005 |
| CN | 202009133 | 10/2011 |
| CN | 205071067 | 3/2016 |
| CN | 105792574 | 7/2016 |

* cited by examiner

*Primary Examiner* — Gary F Paumen

(57) ABSTRACT

The present invention provides a mounting structure of mounting a BTB connector to a mobile terminal, the mounting structure is formed on the BTB connector and a mounting body is attached to the BTB connector, a front end of the mounting body comprises an inserting portion, and a back end of the mounting body comprises at least one hook, height of each of the inserting portion and the hook is arranged under the mounting body, both of the inserting portion and the hook abut a top ending surface of a main board, and a distance between a bottom ending surface of a compressing portion of the mounting body and the top ending surface of the main board is equal to a distance between a top ending surface of the BTB connector and the top ending surface of the main board.

18 Claims, 2 Drawing Sheets

MOUNTING STRUCTURE OF MOUNTING BOARD-TO-BOARD (BTB) CONNECTOR TO MOBILE TERMINAL AND MOBILE TERMINAL

RELATED APPLICATIONS

This application is a National Phase of PCT Patent Application No. PCT/CN2017/076978 having International filing date of Mar. 16, 2017, which claims the benefit of priority of Chinese Patent Application No. 201611153129.1 filed on Dec. 14, 2016. The contents of the above applications are all incorporated by reference as if fully set forth herein in their entirety.

FIELD AND BACKGROUND OF THE INVENTION

The present invention relates to a technical field of mobile terminals, and more particularly to a mounting structure of mounting a board-to-board (BTB) connector to a mobile terminal and the mobile terminal.

A BTB connector is a board-to-board connector, and used for electrically connecting between a couple of circuit boards that are arranged parallel to each other. The BTB connector forms two corresponding surfaces that are connected to each other, and electrically connects two circuit boards.

When the mobile phone is in use, in order to ensure the connecting reliability of electronic components such as an internal circuit board, it is necessary to fix the electronic components such as the internal circuit board by using a fixing member or the like. Among them, the board-to-board (BTB) connector on the internal circuit board of the mobile phone can usually be used to realize the connection between a printed circuit board (PCB) and other circuit boards, such as a flexible circuit board. Because the phone mobile phone shell is thin, in order to ensure the fixing reliability of the board-to-board connector, the additional plate is usually used to press-lock the board-to-board connector. FIG. 1 is a schematic diagram of the internal structure of a mobile phone in the prior art. FIG. 2 is a schematic view showing the structure of the steel plate of FIG. 1. Referring to FIG. 1 and FIG. 2, a steel board 10 configured for mounting a connector in a phone, and screw holes 20 are formed at two ends thereof, and a through hole is defined at a corresponding position on the circuit board 30, and the screw 40 is inserted into the screw hole 20 and the through hole to make the steel plate 10 firmly to be fixed on the circuit board 30, and to make the connector to be sandwiched between the steel board 10 and the circuit board 30.

It can be seen from the above characteristics that a good mounting structure is measured by contribution of a thin type of a mobile terminal and its own fixed stability.

In conventional technologies, a BTB connector is usually fixed by a pad or a long dabber. A mobile terminal can be divided into an all-in-one device and a removable structure with a host back shell.

The host back shell is arranged in back of the removable structure, the pad or the long dabber is formed on a bottom surface of the host back shell, then the host back shell is fixed to a host front shell by screws for compressing the BTB connector. Stability maintenance of the mobile terminal connecting to the BTB connector cannot be detected, and the pad or the long dabber occupies a large space, it works against the thin type of the mobile terminal.

The all-in-one structure does not have a host back shell, but has a battery shell, the battery shell cannot be removed and cannot be fixed by screws, and if the pad or the long dabber is arranged on the battery shell, there are two possible cases. One case is the BTB connector cannot be compressed, the other case is the battery shell is out of shape by being over compressed.

Therefore, conventional technologies have yet to be improved and developed.

SUMMARY OF THE INVENTION

Based on the above-mentioned drawbacks, one objective of the present disclosure is to provide a mounting structure of mounting a board-to-board (BTB) connector to a mobile terminal and the mobile terminal thereof in order to solve a issue in a removable structure of conventional technologies, where the stable maintenance of the mobile terminal connecting with the BTB connector cannot be detected and the space is occupied by the pad or the long dabber, which goes against thin mobile terminals; and in order to solve a issue in the all-in-one structure where the BTB connector cannot be compressed and the battery shell is out of shape by being over compressed.

For the above-mentioned objective, the present disclosure employs the following technical schemes.

A mounting structure of mounting a BTB connector to a mobile terminal, the mounting structure of mounting the BTB connector to the mobile terminal is formed on the BTB connector, the mounting structure comprising:

a mounting body attached to the BTB connector, a front end of the mounting body comprising an inserting portion that is inserted into and connected to a shielding case, and a back end of the mounting body comprising at least one hook that hooks an edge of a main board.

In one exemplary embodiment, in the mounting structure of mounting the BTB connector to the mobile terminal, a right side of the back end of the mounting body comprises a hook, and a left side of the back end of the mounting body comprises a screw fastener that is threadedly connected to the main board of the mobile terminal.

In one exemplary embodiment, in the mounting structure of mounting the BTB connector to the mobile terminal, the mounting body comprises:

a compressing portion placed at the front end of the mounting body, and connected to the inserting portion, the compressing portion is formed corresponding to the BTB connector; and a limiting portion placed at the back end of the mounting body, and connected to the hook and the screw fastener, a height of the limiting portion is arranged under the compressing portion, for connecting the hook and the screw fastener to the compressing portion, and limiting the BTB connector to move back.

In one exemplary embodiment, in the mounting structure of mounting the BTB connector to the mobile terminal, the hook comprises:

an attaching portion formed on a front end of the hook, connected to the limiting portion, and attached to a top ending surface of the main board;

a top abutting portion formed on a back end of the hook, upwardly and incliningly abutting to a bottom ending surface of the main board; and a connecting portion being arranged parallel to a side surface of the main board, for connecting the attaching portion and the top abutting portion.

In one exemplary embodiment, in the mounting structure of mounting the BTB connector to the mobile terminal, a height of the hook is arranged under the limiting portion.

In one exemplary embodiment, in the mounting structure of mounting the BTB connector to the mobile terminal, the hook comprises:

a locking portion formed at a front end of the screw fastener, and connected to the limiting portion, the locking portion has a screw hole or a through hole, and is fastened to the main board by a bolt; and an adjusting portion formed at a back end of the screw fastener, and being arranged parallel to the side surface of the main board, a mounting place of the mounting structure is adjusted by paralleling the adjusting portion to the side surface of the main board, or by a predetermined distance from the side surface of the main board of the mobile terminal.

In one exemplary embodiment, in the mounting structure of mounting the BTB connector to the mobile terminal, a height of the screw fastener is arranged under the limiting portion, and a top part is arranged parallel and level to a top part of the hook.

In one exemplary embodiment, in the mounting structure of mounting the BTB connector to the mobile terminal, the inserting portion front upwardly and incliningly abuts to a bottom ending surface of the shielding case.

A mobile terminal comprises a mounting structure of mounting a BTB connector to the mobile terminal, a recess is formed on the shielding case corresponding to the inserting portion.

Compared with conventional technologies, the present disclosure provides a mounting structure of mounting a BTB connector to a mobile terminal, the mounting structure of mounting the BTB connector to the mobile terminal is formed on the BTB connector and a mounting body is attached to the BTB connector, a front end of the mounting body comprises an inserting portion that is inserted into and connected to a shielding case, and a back end of the mounting body comprises at least one hook that hooks an edge of a main board, height of each of the inserting portion and the hook is arranged under the mounting body. Both of the inserting portion and the hook abut a top ending surface of the main board, and a distance between a bottom ending surface of the compressing portion of the mounting body and the top ending surface of the main board is equal to a distance between a top ending surface of the BTB connector and the top ending surface of the main board. That makes the BTB connector be fixed with the mounting structure, and the stability maintenance of the mobile terminal connecting to the BTB connector can be detected, and then the BTB connector is assembled with the host shell. That solves an issue in the removable structure of conventional technologies, where the stable maintenance of the mobile terminal connecting with the BTB connector cannot be detected and the space is occupied by the pad or the long dabber, and it works against thin the mobile terminal. And because a distance between a bottom ending surface of the compressing portion of the mounting body and the top ending surface of the main board is equal to a distance between a top ending surface of the BTB connector and the top ending surface of the main board, that solves an issue in the all-in-one structure where the BTB connector cannot be compressed and the battery shell is out of shape by being over compressed. On this basis, it is easy to assemble the inserting portion and the hook by the inserting portion and the hook, and a front end and a back end of the mounting structure respectively connects to the shielding case and the main board, and the stability maintenance of the BTB connector is improved.

DESCRIPTION OF SPECIFIC EMBODIMENTS OF THE INVENTION

The present disclosure is to provide a mounting structure of mounting a BTB connector to a mobile terminal and the mobile terminal. The following embodiments refer to the accompanying drawings for exemplifying specific implementable embodiments of the present disclosure. It should be noted that the exemplary described embodiments are used to describe and understand the present disclosure, but the present disclosure is not limited thereto.

Figure 1:
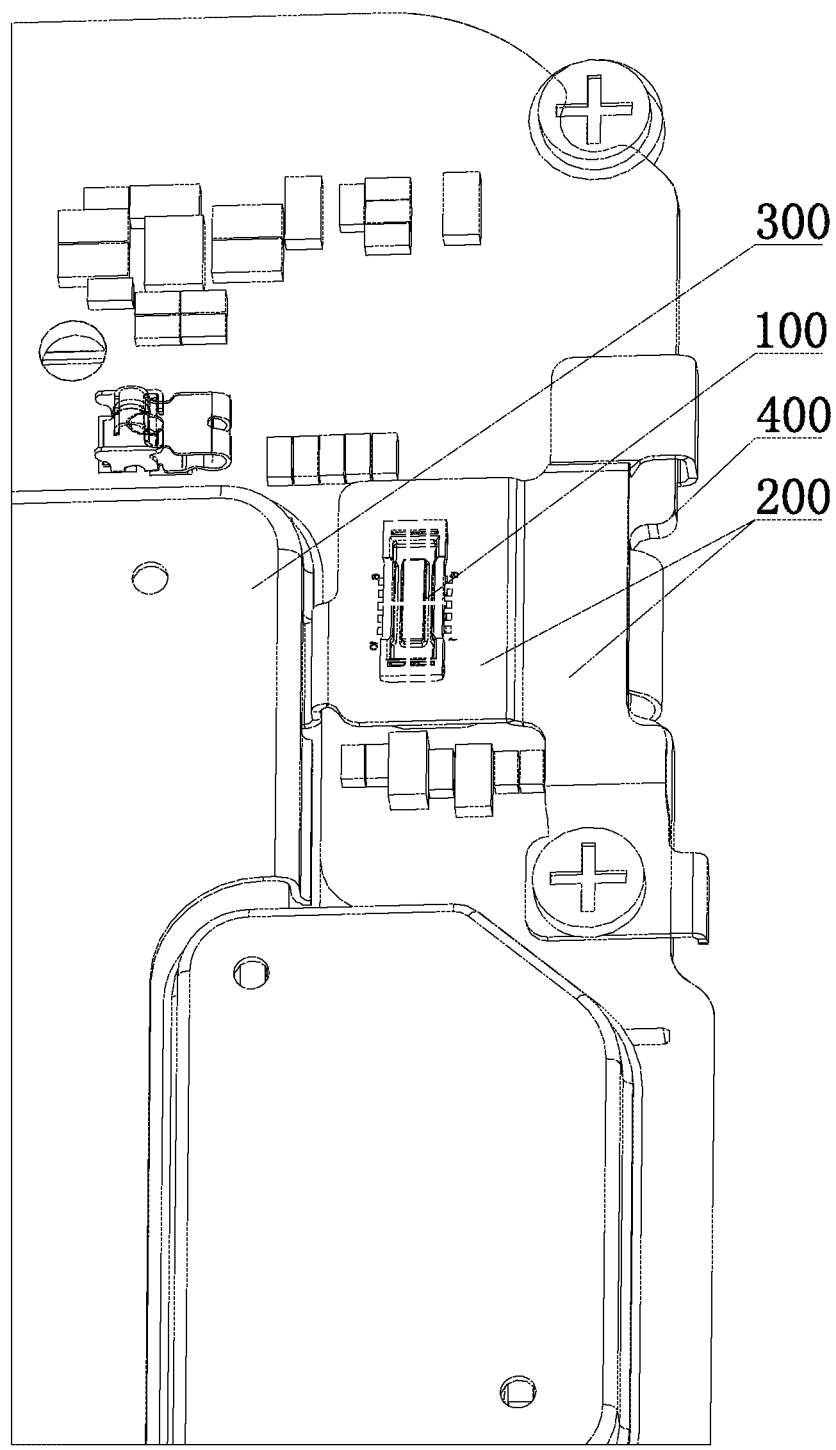
FIG. 1 is a structure diagram of a mobile terminal according to one exemplary embodiment of the present disclosure.

Referring to FIG. 1, the present disclosure provides a mobile terminal, the mobile terminal comprising a BTB connector 100, a mounting structure 200 arranged on the BTB connector 100 for mounting the BTB connector 100 to the mobile terminal, a shielding case 300 arranged on front of the mounting structure 200 for inserting the mounting structure 200, and a main board 400 arranged under the mounting structure 200 for hooking a back end of the mounting structure 200.

Figure 2:
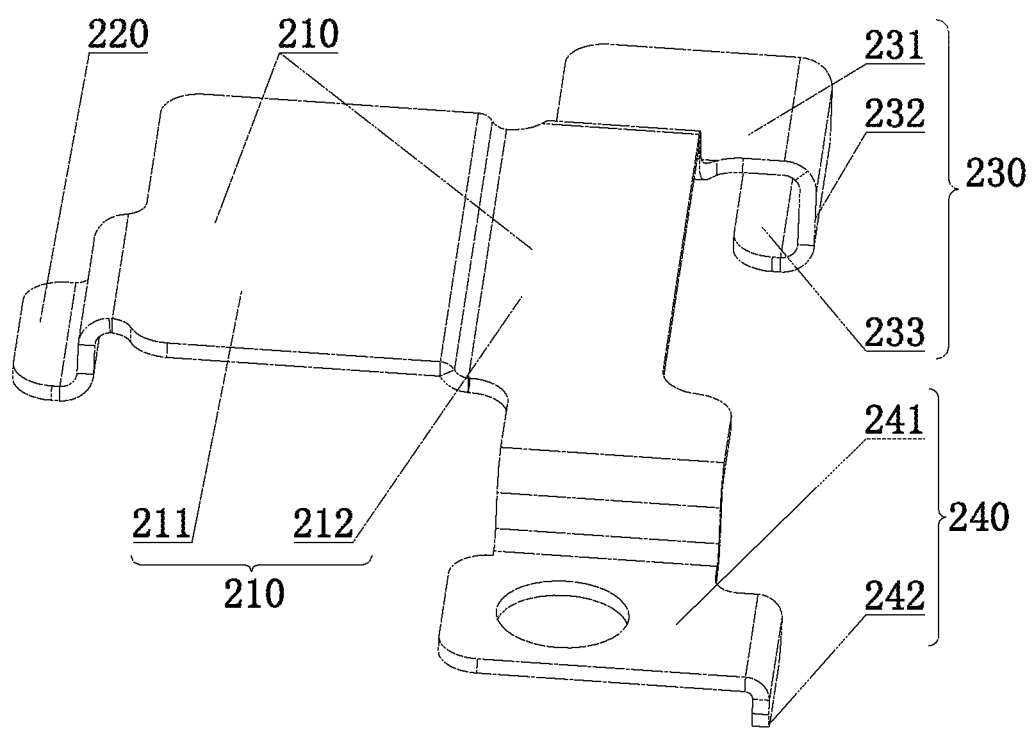
FIG. 2 is a mounting structure of mounting a BTB connector to a mobile terminal according to one exemplary embodiment of the present disclosure.

Referring to FIG. 2, in one exemplary embodiment, the mounting structure 200 of mounting the BTB connector 100 to the mobile terminal comprises a mounting body 210 attached to the BTB connector 100. A front end of the mounting body 210 comprises an inserting portion 220 that is inserted into and connected to the shielding case 300, and a back end of the mounting body 210 comprises at least one hook 230 that hooks an edge of the main board 400e the inserting portion 220 and the hook 230 is arranged under the mounting body 210. Both of the inserting portion 220 and the hook 230 abut a top ending surface of the main board 400, and a distance between a bottom ending surface of the mounting body 210 and the top ending surface of the main board 400 is equal to a distance between a top ending surface of the BTB connector 100 and the top ending surface of the main board 400.

In one exemplary embodiment, the mounting body 210 comprises a compressing portion 211 placed at the front end of the mounting body 210 and is connected to the inserting portion 220. The compressing portion 211 is arranged corresponding to the BTB connector 100. The mounting body 210 comprises a limiting portion 212 placed at the back end of the mounting body 210 and is connected to the hook 230, a height of the limiting portion 212 is arranged under the compressing portion 211 for connecting the hook 230 and the compressing portion 211 and limiting the BTB connector 100 to move back.

The hook 230 comprises: an attaching portion 231 formed on a front end of the hook 230, connected to the limiting portion 212, and attached to a top ending surface of the main board 400; a top abutting portion 233 formed on a back end of the hook 230, upwardly and incliningly abutting to a bottom ending surface of the main board 400, and a connecting portion 232 being arranged parallel to a side surface of the main board 400 for connecting the attaching portion 231 and the top abutting portion 233. A height of the hook 230 is arranged under the limiting portion 212.

The inserting portion 220 front upwardly and incliningly abuts to a bottom ending surface of the shielding case 300.

Compared with conventional technologies, the present disclosure provides a mounting structure of mounting a BTB connector to a mobile terminal, the mounting structure of mounting the BTB connector to the mobile terminal is formed on the BTB connector and a mounting body is attached to the BTB connector, a front end of the mounting body comprises an inserting portion that is inserted into and connected to a shielding case, and a back end of the mounting body comprises at least one hook that hooks an edge of a main board, height of each of the inserting portion and the hook is arranged under the mounting body. Both of the inserting portion and the hook abut a top ending surface of the main board, and a distance between a bottom ending surface of the compressing portion of the mounting body and the top ending surface of the main board is equal to a distance between a top ending surface of the BTB connector and the top ending surface of the main board. That makes the BTB connector be fixed with the mounting structure, and the stable maintenance of the mobile terminal connecting to the BTB connector can be detected, and then the BTB connector is assembled with the host shell. That solves the issue in the removable structure of conventional technologies where the stable maintenance of the mobile terminal connecting with the BTB connector cannot be detected and the space is occupied by the pad or the long dabber, and works against thin mobile terminals. Because a distance between a bottom ending surface of the compressing portion of the mounting body and the top ending surface of the main board is equal to a distance between a top ending surface of the BTB connector and the top ending surface of the main board, is solves the issues in all-in-one structures where the BTB connector cannot be compressed and the battery shell is out of shape by being over compressed. On this basis, it is easy to assemble the inserting portion and the hook by the inserting portion and the hook, and a front end and a back end of the mounting structure respectively connects to the shielding case and the main board, and the stable maintenance of the BTB connector is improved.

In one exemplary embodiment, a right side of the back end of the mounting body 210 comprises a hook 230, and a left side of the back end of the mounting body comprises a screw fastener 240, where the screw fastener 240 is threadedly connected to the main board 400.

The screw fastener 240 comprises: a locking portion 241 formed at a front end of the screw fastener 240, and connected to the limiting portion 212, the locking portion 241 has a screw hole or a through hole, and is fastened to the main board 400 by a bolt; an adjusting portion 242 formed at a back end of the screw fastener 240, and the adjusting portion 242 is arranged parallel to the side surface of the main board 400, a mounting place of the mounting structure 200 is adjusted by arranging the adjusting portion 242 parallel to the side surface of the main board 400, or by a predetermined distance from the side surface of the main board 400. A height of the screw fastener 240 is arranged under the limiting portion 212, and a top part of the screw fastener 240 is arranged parallel and level to a top part of the hook 230.

The mounting body 210 comprises: a compressing portion 211 placed at the front end of the mounting body 210, and connected to the inserting portion 220, the compressing portion 211 is arranged corresponding to the BTB connector 100; and a limiting portion 212 placed at the back end of the mounting body 210, and connected to the hook 230 and the screw fastener 240, a height of the limiting portion 212 is arranged under the compressing portion 211 for connecting the hook 230 and the screw fastener 240 to the compressing portion 211, and limiting the BTB connector 100 to move back.

As is understood by persons skilled in the art, the foregoing preferred embodiments of the present disclosure are illustrative rather than limiting of the present disclosure. It is intended that they cover various modifications and that similar arrangements be included in the spirit and scope of the present disclosure, the scope of which should be accorded the broadest interpretation so as to encompass all such modifications and similar structures.

What is claimed is:

1. A mounting structure of mounting a board-to-board (BTB) connector to a mobile terminal, wherein the mounting structure of mounting the BTB connector to the mobile terminal is arranged on the BTB connector, the mounting structure comprising:
    a mounting body attached to the BTB connector, a front end of the mounting body comprising an inserting portion that is inserted into and connected to a shielding case, and a back end of the mounting body comprising at least one hook that hooks an edge of a main board, wherein the mounting body comprises a first edge, a second edge, a third edge, and a fourth edge, the first edge is opposite to the second edge, the third edge is opposite to the fourth edge, the inserting portion is connected to the first edge and arranged near the fourth edge, the hook is connected to the third edge and arranged near the second edge, and the mounting body further comprises a screw fastener, the screw fastener is connected to the fourth edge and near the second edge.

2. The mounting structure of mounting the BTB connector to the mobile terminal of claim 1, wherein the mounting body comprises:
    a compressing portion placed at the front end of the mounting body and connected to the inserting portion, wherein the compressing portion is arranged corresponding to the BTB connector; and
    a limiting portion placed at the back end of the mounting body and connected to the hook and the screw fastener, wherein a height of the limiting portion is arranged under the compressing portion, for connecting the hook and the screw fastener to the compressing portion, and limiting the BTB connector to move back.

3. The mounting structure of mounting the BTB connector to the mobile terminal of claim 2, wherein the hook comprises:
    an attaching portion formed on a front end of the hook, connected to the limiting portion, and attached to a top ending surface of the main board;
    a top abutting portion formed on a back end of the hook, upwardly and inclingly abutting to a bottom ending surface of the main board; and
    a connecting portion being arranged parallel to a side surface of the main board, for connecting the attaching portion and the top abutting portion.

4. The mounting structure of mounting the BTB connector to the mobile terminal of claim 3, wherein a height of the hook is arranged under the limiting portion.

5. The mounting structure of mounting the BTB connector to the mobile terminal of claim 2, wherein the screw fastener comprises:

a locking portion formed at a front end of the screw fastener, and connected to the limiting portion, the locking portion has a screw hole or a through hole, and is fastened to the main board by a bolt; and an adjusting portion formed at a back end of the screw fastener, and being arranged parallel to the side surface of the main board, a mounting place of the mounting structure is adjusted by parallely arranging the adjusting portion to the side surface of the main board, or by a predetermined distance from the side surface of the main board of the mobile terminal.

6. The mounting structure of mounting the BTB connector to the mobile terminal of claim 2, wherein a height of the screw fastener is arranged under the limiting portion, and a top part is arranged parallel and level to a top part of the hook.

7. The mounting structure of mounting the BTB connector to the mobile terminal of claim 1, wherein the inserting portion front upwardly and incliningly abuts to a bottom ending surface of the shielding case.

8. A mounting structure of mounting a board-to-board (BTB) connector to a mobile terminal, wherein the mounting structure of mounting the BTB connector to the mobile terminal is formed on the BTB connector, the mounting structure comprising: a mounting body attached to the BTB connector, a front end of the mounting body comprising an inserting portion that is inserted into and connected to a shielding case, and a back end of the mounting body comprising at least one hook that hooks an edge of a main board, wherein the mounting body comprises a first edge, a second edge, a third edge, and a fourth edge, the first edge is opposite to the second edge, the third edge is opposite to the fourth edge, the inserting portion is connected to the first edge and arranged near the fourth edge, the hook is connected to the third edge and arranged near the second edge, and the mounting body further comprises a screw fastener, the screw fastener is connected to the fourth edge and near the second edge;

the mounting body comprises: a compressing portion placed at the front end of the mounting body, and connected to the inserting portion, wherein the compressing portion is formed corresponding to the BTB connector; and a limiting portion placed at the back end of the mounting body, and connected to the hook and the screw fastener, wherein a height of the limiting portion is arranged under the compressing portion, for connecting the hook and the screw fastener to the compressing portion, and limiting the BTB connector to move back; and wherein height of each of the inserting portion and the hook is arranged under the mounting body, both of the inserting portion and the hook abut a top ending surface of the main board, and a distance between a bottom ending surface of the compressing portion of the mounting body and the top ending surface of the main board is equal to a distance between a top ending surface of the BTB connector and the top ending surface of the main board.

9. The mounting structure of mounting the BTB connector to the mobile terminal of claim 8, wherein the hook comprises:

an attaching portion formed on a front end of the hook, connected to the limiting portion, and attached to a top ending surface of the main board;

a top abutting portion formed on a back end of the hook, upwardly and incliningly abutting to a bottom ending surface of the main board;

a connecting portion being arranged parallel to a side surface of the main board, for connecting the attaching portion and the top abutting portion; and height of the hook is arranged under the limiting portion.

10. The mounting structure of mounting the BTB connector to the mobile terminal of claim 8, wherein the screw fastener comprises:

a locking portion formed at a front end of the screw fastener, and connected to the limiting portion, the locking portion has a screw hole or a through hole, and is fastened to the main board by a bolt;

an adjusting portion formed at a back end of the screw fastener, and being arranged parallel to the side surface of the main board, a mounting place of the mounting structure is adjusted by parallely arranging the adjusting portion to the side surface of the main board, or by a predetermined distance from the side surface of the main board of the mobile terminal; and a height of the screw fastener is arranged under the limiting portion, and a top part is arranged parallel and level to a top part of the hook.

11. The mounting structure of mounting the BTB connector to the mobile terminal of claim 8, wherein the inserting portion front upwardly and incliningly abuts to a bottom ending surface of the shielding case.

12. A mobile terminal, comprising a mounting structure configured for mounting a BTB connector to the mobile terminal, wherein the mounting structure is formed on the BTB connector, the mounting structure comprising:

a mounting body attached to the BTB connector, a front end of the mounting body comprising an inserting portion that is inserted into and connected to a shielding case, and a back end of the mounting body comprising at least one hook that hooks an edge of a main board, wherein the mounting body comprises a first edge, a second edge, a third edge, and a fourth edge, the first edge is opposite to the second edge, the third edge is opposite to the fourth edge, the inserting portion is connected to the first edge and arranged near the fourth edge, the hook is connected to the third edge and arranged near the second edge, and the mounting body further comprises a screw fastener, the screw fastener is connected to the fourth edge and near the second edge; and a recess formed on the shielding case corresponding to the inserting portion.

13. The mobile terminal of claim 12, wherein the mounting body comprises:

a compressing portion placed at the front end of the mounting body, and connected to the inserting portion, wherein the compressing portion is arranged corresponding to the BTB connector; and a limiting portion placed at the back end of the mounting body, and connected to the hook and the screw fastener, wherein a height of the limiting portion is arranged under the compressing portion, for connecting the hook and the screw fastener to the compressing portion, and limiting the BTB connector to move back.

14. The mobile terminal of claim 13, wherein height of each of the inserting portion and the hook is arranged under the mounting body, both of the inserting portion and the hook abut a top ending surface of the main board, and a distance between a bottom ending surface of the compressing portion of the mounting body and the top ending surface of the main board is equal to a distance between a top ending surface of the BTB connector and the top ending surface of the main board.

15. The mobile terminal of claim 13, wherein the hook comprises:
   an attaching portion formed on a front end of the hook, connected to the limiting portion, and attached to a top ending surface of the main board;
   a top abutting portion formed on a back end of the hook, upwardly and incliningly abutting to a bottom ending surface of the main board; and
   a connecting portion being arranged parallel to a side surface of the main board, for connecting the attaching portion and the top abutting portion.

16. The mobile terminal of claim 13, wherein the screw fastener comprises:
   a locking portion formed at a front end of the screw fastener, and connected to the limiting portion, the locking portion has a screw hole or a through hole, and is fastened to the main board by a bolt; and
   an adjusting portion formed at a back end of the screw fastener, and being arranged parallel to the side surface of the main board, a mounting place of the mounting structure is adjusted by parallely arranging the adjusting portion to the side surface of the main board, or by a predetermined distance from the side surface of the main board of the mobile terminal.

17. The mobile terminal of claim 16, wherein a height of the hook is arranged under the limiting portion; a height of the screw fastener is arranged under the limiting portion, and a top part is arranged parallel and level to a top part of the hook.

18. The mobile terminal of claim 12, wherein the inserting portion front upwardly and incliningly abuts to a bottom ending surface of the shielding case.

* * * * *

UNITED STATES PATENT AND TRADEMARK OFFICE
CERTIFICATE OF CORRECTION

| | | |
|---|---|---|
| PATENT NO. | : 10,573,984 B2 | Page 1 of 1 |
| APPLICATION NO. | : 15/744797 | |
| DATED | : February 25, 2020 | |
| INVENTOR(S) | : Huajun Cheng et al. | |

It is certified that error appears in the above-identified patent and that said Letters Patent is hereby corrected as shown below:

On the Title Page

Insert the following:
-- (30) *Foreign Application Priority Data*
Dec. 14, 2016 (CN)................... 201611153129.1 --

Signed and Sealed this
Twenty-eighth Day of July, 2020

Andrei Iancu
*Director of the United States Patent and Trademark Office*